United States Patent [19]
Moritz et al.

[11] Patent Number: 5,864,235
[45] Date of Patent: Jan. 26, 1999

[54] NUCLEAR MAGNETIC RESONANCE TOMOGRAPHY APPARATUS WITH A COMBINED RADIO-FREQUENCY ANTENNA AND GRADIENT COIL STRUCTURE

[75] Inventors: Michael Moritz, Mistelgau; Guenther Pausch, Effeltrich, both of Germany

[73] Assignee: Siemens Aktiengesellschaft, Munich, Germany

[21] Appl. No.: 894,205

[22] PCT Filed: Jan. 26, 1996

[86] PCT No.: PCT/DE96/00112

§ 371 Date: Jul. 30, 1997

§ 102(e) Date: Jul. 30, 1997

[87] PCT Pub. No.: WO96/24857

PCT Pub. Date: Aug. 15, 1996

[30] Foreign Application Priority Data

Feb. 6, 1995 [DE] Germany .......................... 19503833.9

[51] Int. Cl.⁶ .................................................. G01V 3/00
[52] U.S. Cl. ........................................... 324/318; 324/322
[58] Field of Search ..................................... 324/318, 322, 324/300, 314, 307, 309; 128/653.5; 600/421

[56] References Cited

U.S. PATENT DOCUMENTS

| | | |
|---|---|---|
| 4,486,711 | 12/1984 | Frese et al. ............................... 324/319 |
| 4,506,224 | 3/1985 | Krause ...................................... 324/319 |
| 4,794,338 | 12/1988 | Roemer et al. ........................... 324/318 |
| 4,878,023 | 10/1989 | Overweg et al. ........................ 324/318 |
| 5,012,192 | 4/1991 | Siebold .................................... 324/318 |
| 5,111,147 | 5/1992 | Aubert ..................................... 324/318 |
| 5,185,576 | 2/1993 | Vavrek et al. ........................... 324/318 |
| 5,198,769 | 3/1993 | Frese et al. .............................. 324/318 |
| 5,293,126 | 3/1994 | Schaefer .................................. 324/318 |
| 5,372,137 | 12/1994 | Wong et al. ............................. 324/318 |
| 5,396,174 | 3/1995 | Hanke et al. ............................ 324/318 |

FOREIGN PATENT DOCUMENTS

| | | |
|---|---|---|
| 0 307 981 | 3/1989 | European Pat. Off. . |
| 0 580 324 | 7/1994 | European Pat. Off. . |
| WO 94/11749 | 5/1994 | WIPO . |

*Primary Examiner*—Louis Arana
*Attorney, Agent, or Firm*—Hill & Simpson

[57] ABSTRACT

A nuclear magnetic resonance tomography apparatus with a combined radio-frequency antenna and gradient coil structure has a gradient coil is divided onto at least two cylinder surfaces concentric with one another. Useful conductors of the gradient coil lie closer to the examination space than its connecting conductors. A radio-frequency antenna is built to the interspace between the inner useful conductors and the connecting conductors that lie farther toward the outside. The arrangement occupies less space in the magnet as a result of the combined structure.

6 Claims, 3 Drawing Sheets

NUCLEAR MAGNETIC RESONANCE TOMOGRAPHY APPARATUS WITH A COMBINED RADIO-FREQUENCY ANTENNA AND GRADIENT COIL STRUCTURE

The present invention is directed to a nuclear magnetic tomography apparatus having a basic field magnet with an examination space in which at least one gradient coil and one radio-frequency antenna are integrated, with each gradient coil being composed of useful conductors and of connecting conductors as used herein, "useful conductor" means a conductor which is designed to essentially determine the gradient field which is employed in producing a tomographic image.

DESCRIPTION OF THE PRIOR ART

In a nuclear magnetic resonance tomography apparatus, as is known, a basic field magnet is required with which nuclear spins in an examination region are oriented in a specific direction. For the deflection of the nuclear spins in this direction, electromagnetic energy is beamed onto the examination subject with a radio-frequency antenna and—possibly with the same radio-frequency antenna—the arising nuclear magnetic resonance signal is received. U.S. Pat. No. 4,506,224 discloses a simple example of such a radio-frequency antenna. The radio-frequency antenna is thereby composed of individual rods that are connected to ground at one side via capacitors.

Further, magnetic gradient fields are required for the location coding of the arising nuclear magnetic resonance signals, these magnetic gradient fields being generated by a set of gradient coils for each spatial direction (for example, the x, y, z directions of a Cartesian coordinate system). U.S. Pat. No. 4,486,711 discloses a simple exemplary embodiment of such gradient coils. As schematically shown in FIG. 1, therein this basic structure includes a superconductive basic field magnet 1 having a cylindrical opening 1a. The cylindrical opening 1a, which is generally referred to as the "warm bore", is constricted in conventional systems by the gradient coils 2 and the radio-frequency antenna 3 to be introduced within the opening 1a. FIG. 1 also schematically shows a radio-frequency shield 5 that shields the radio-frequency antenna 3 toward the outside. The diameter of the warm bore 1 a is correspondingly larger in view of the elements integrated therein than the patient opening available for the examination. Since the diameter of the patient opening cannot be permitted to fall below a certain minimum dimension in view of the bearing comfort for the patient, the size of the warm bore 1a is determined by the defined patent opening and the thickness of the radio-frequency antenna, the gradient coil and further elements built thereinto. These further built-in elements such as, for example, shim elements for improving the uniformity of the basic magnetic field, are not shown in FIG. 1 for clarity. Compared to the gradient coil and to the radio-frequency antenna, however, these elements occupy far less space.

The outlay therefor becomes higher the warm bore of the magnet becomes larger, particularly due to the higher costs for superconductors.

The above applies analogously to pole shoe magnets wherein radio-frequency antenna and gradient coils are applied onto the pole shoes and the spacing between the pole shoes is essentially defined by the height of the patient opening and the height of radio-frequency antenna and of the gradient coil.

European Application 0 307 981 discloses an integrated arrangement of radio-frequency antenna and gradient coils. The space requirements for these elements should thus be reduced and the energy requirement for the gradient coils should also be reduced. In one embodiment, parts of the radio-frequency antenna thereby lie between turns of the gradient coils. In this arrangement, however, the coupling between the radio-frequency antenna and the gradient coils is problematical.

SUMMARY OF THE INVENTION

It is an object of the present invention to provide a nuclear magnet resonance tomography apparatus of the type described above wherein, given a prescribed size of the patient opening, the basic field magnet can be kept optimally small, with the radio-frequency antenna and gradient coils being largely decoupled.

The above object is achieved in accordance with the principles of the present invention in a nuclear magnetic resonance tomography apparatus having a basic field magnet with an examination space into which at least one gradient coil and a radio-frequency antenna are built, the gradient coil being composed of useful conductors disposed on a first surface and connecting conductors on a second surface, the second surface being substantially parallel to the first surface and being at a larger spacing from the examination space, and wherein the radio-frequency antenna is formed by a structure of a number of parallel, straight conductors disposed perpendicularly relative to the useful conductors, and being completely enclosed in the interspace between the first and second surfaces, and having a radio-frequency shield disposed between the connecting conductors and the radio-frequency antenna.

Due to the spatial accommodation of the radio-frequency antenna within the individual conductors of the gradient coil, the space requirement for gradient coil plus radio-frequency antenna is reduced, so that the magnet can be built smaller given the same patient opening, this leading to noticeable cost-savings. Due to the arrangement of the radio-frequency antenna between the two surfaces and the shielding relative to the connecting conductors, a far-reaching decoupling is achieved between the gradient coils and the radio-frequency antenna. Due to the straight-line conductor structure of the radio-frequency antenna, disturbances to the homogeneity of the radio-frequency field are avoided.

DESCRIPTION OF THE PREFERRED EMBODIMENTS

Figure 1:
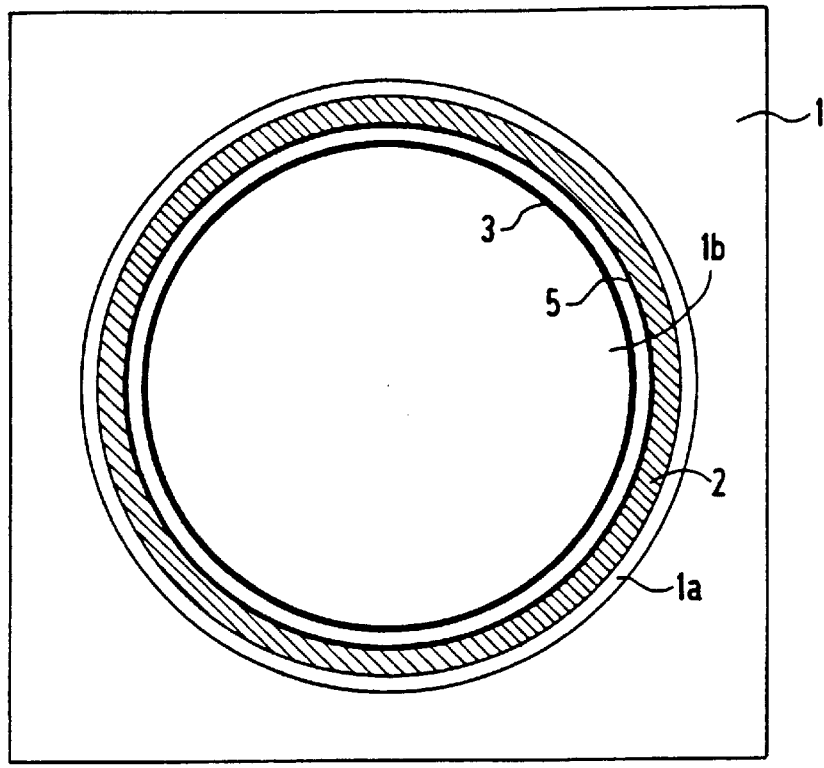
FIG. 1, as noted above, is a schematic illustration of a known tomography apparatus, in a cross-sectional view.
Figure 2:
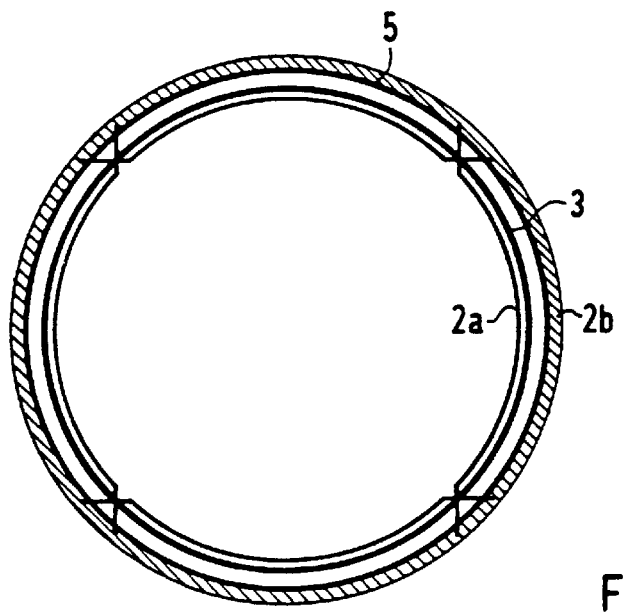
FIG. 2 is a schematic illustration of a first exemplary embodiment of a tomography apparatus constructed in accordance with the principles of the present invention in a cross-sectional view.

As can be seen from the schematic illustration of the invention shown in an exemplary embodiment of FIG. 2, the conductors of the gradient coils lie on two cylindrical surfaces that are concentric relative to one another and have a different radius, with the radio-frequency antenna being arranged between these two cylinder surfaces. The radio-frequency antenna 3 itself is not depicted in detail since only its spatial arrangement but not its structure form the subject matter of the invention. For example, a planar conductor 25 structure as shown in German 05 43 01 557 can be employed as a radio-frequency antenna 3.

In the case of the gradient coils as well, the only important feature in the context of the invention the spatial arrangement but not the specific gradient coil design. For example, a gradient coil design may be found in U.S. Pat. No. 5,012,192.

Gradient coils with conductor sections that lie on different cylinder surfaces are in fact already disclosed by U.S. Pat. No. 5,198,769. The radio-frequency antenna therein, however, does not lie between these two cylinder surfaces but is conventionally applied, so that the high space requirement exists.

Only the transversal gradient coils are schematically shown in FIG. 2, i.e. those gradient coils that produce the magnetic field gradient perpendicular to the direction of the basic field that lies in the direction of the cylinder axis. As is known, respective pairs of subcoils 2(x), 2(x)'; 2(y), 2(y)', lying opposite one another, as shown in FIG. 2, are required for the transversal gradients for each gradient direction (generally referenced x and y).

In every gradient coil 2, there are useful conductors 2a that directly generate the desired magnetic field and connecting conductors 2b that connect the useful conductors and whose influence on the gradient field is left out of consideration in simple designs. Given more sophisticated gradient coil designs, the effect of the connecting conductors is also taken into account, and the calculation of the magnetic field ensues such that the entire unit of useful conductors/connecting conductors is optimized. In the inventive arrangement, the useful conductors 2a lie on the inner cylinder surface, so that the energy and, thus, the inductance of the gradient coils is reduced given the same gradient field strength due to the smaller coil diameter. A gradient amplifier having lower power thus can also be employed, or a higher gradient field can be generated with a given power. As a result of the reduced energy consumption, or the lower integration density, the cooling outlay for the gradient coil is also reduced. Under certain circumstances, air cooling can thus be utilized in instances where water cooling was hitherto required.

The entire structural height of gradient coil—radio-frequency antenna is reduced by the nested structure, so that a larger patient opening is available given the same warm bore of the basic field magnet or the basic field magnet can be built smaller given the same patient opening. Either a gain in patient comfort or a cost saving can thus be achieved.

Figure 3:
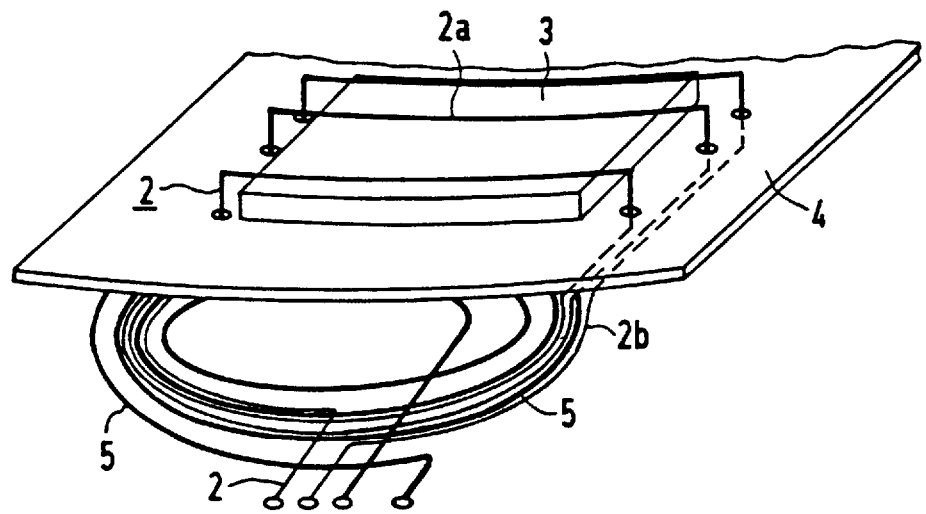
FIG. 3 is a schematic, perspective view of the arrangement of FIG. 1.

The arrangement of gradient coil 2 and radio-frequency antenna 3 is schematically shown in a perspective view in FIG. 3. The entire arrangement is secured on a support tube 4. Toward the examination space, a radio-frequency antenna 3 in the form of a planar conductor that extends in the direction of the basic magnetic field is secured on the support tube 4. The useful conductors 2a of the gradient coil 2 are arranged above the radio-frequency antenna 3. The connecting conductors 2b that connect the useful conductors 2a to one another and to a gradient amplifier (not shown) are arranged at the opposite side of the support tube 4.

The gradient coil 2 can also be actively shielded toward the outside, so that the magnetic field generated by the gradient coil is highly attenuated outside the examination space and, thus, produces fewer eddy currents. A specific shielding coil 6 is required for shielding, this likewise lying at the underside of the support tube 4. The concept of active shielding of gradient coils is explained, for example, in U.S. Pat. No. 4,878,023.

Figure 4:
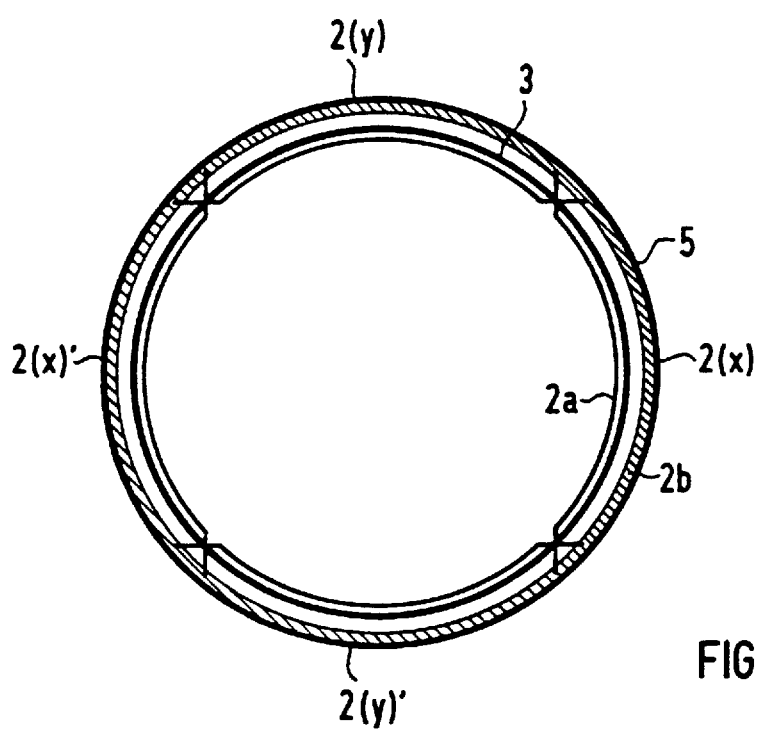
FIG. 4 is a second exemplary embodiment of a tomography apparatus constructed in accordance with the principles of the present invention shown schematically in a cross-sectional view.

In order to prevent an emission of radio-frequency power from the radio-frequency antenna 3 toward the outside and in order to prevent influence on the radio-frequency antenna 3 from the outside, a radio-frequency shielding 5 is provided. As shown in the exemplary embodiment of FIG. 4, this, for example, can surround the entire arrangement or—as shown in the exemplary embodiment of FIG. 2—can lie between the radio-frequency antenna 3 and the connecting conductors 2b. The function of the radio-frequency shielding can also be assumed by conductor parts of the gradient coil 2. In order to obtain a closed radio-frequency shielding surface, the individual shield elements or gradient conductors are capacitively connected to one another.

Figure 5:
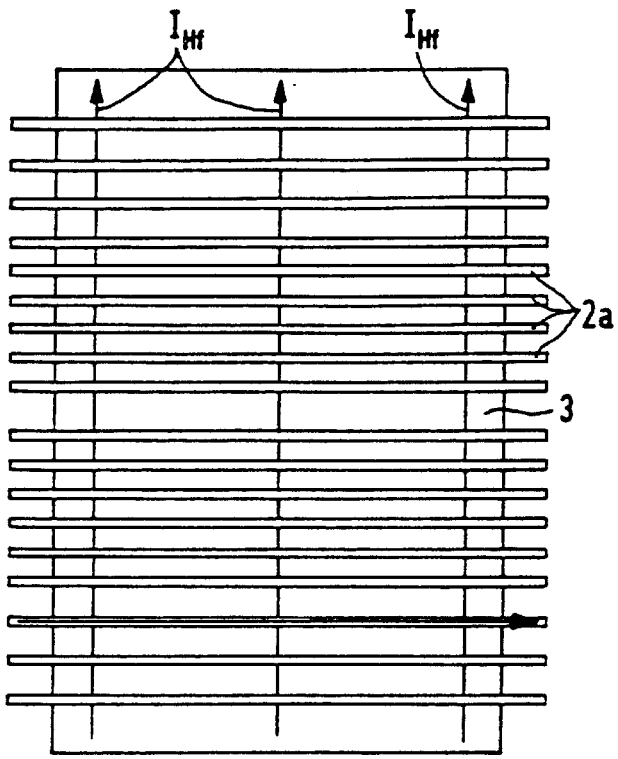
FIG. 5 is a plan view of the conductor arrangement for the radio-frequency antenna, showing the current direction, in accordance with the invention.
Figure 6:
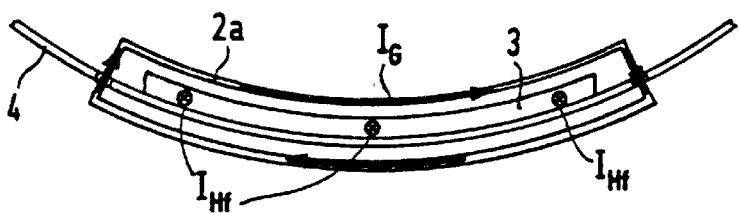
FIG. 6 shows a cross-section of the arrangement of FIG. 5, also showing the current directions.

The arrangement of the gradient coil/radio-frequency antenna must be selected such that a minimum coupling of the magnetic field derives and such that the radio-frequency magnetic field can take effect optimally unimpeded by the useful conductors 2a. This is explained below with references to FIGS. 5–7. FIG. 5 shows the arrangement of the useful conductors 2a over the planar conductor structure of the radio-frequency antenna 3 with the corresponding current directions in plan view. The radio-frequency current $I_{hf}$ through the radio-frequency antenna 3 runs in the longitudinal direction of the radio-frequency antenna 3, i.e. in the direction of the basic magnetic field. The currents $I_G$ through the useful conductors 2a proceed perpendicularly thereto. There is thus no magnetic coupling in the ideal case.

The illustrated arrangement also has the advantage that the useful conductors 2a shield the electrical field component E of the radio-frequency field relative to the examination space. The electrical field components E do not contribute to the nuclear magnetic resonance signal. They merely increase the radio-frequency power absorbed by the examination subject and thus lead to an undesirable warming and to an increased load on the radio-frequency transmitter.

Figure 7:
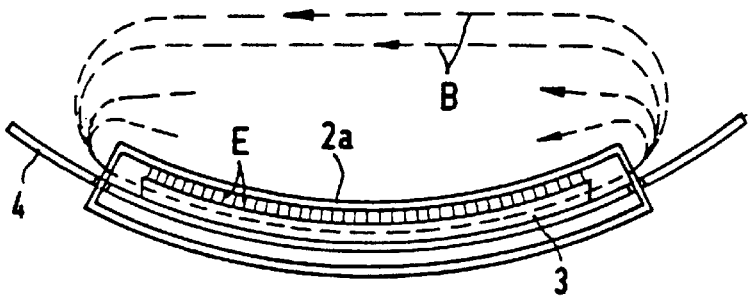
FIG. 7 shows the field course in the exemplary embodiment of FIGS. 5 and 6.

The shielding effect of the combination of radio-frequency antenna 3 and the gradient coil 2 is shown in FIG. 7. The electrical field lines of the radio-frequency field proceed essentially between the radio-frequency antenna 3 and the useful conductors 2a of the gradient coil. The magnetic field lines B, by contrast, are not disturbed by the gradient coil arrangement since the useful conductors 2a lie in the direction of these field lines.

Although modifications and changes may be suggested by those skilled in the art, it is the intention of the inventor to embody within the patent warranted hereon all changes and modifications as reasonably and properly come within the scope of his contribution to the art.

We claim:

1. A nuclear magnetic resonance tomography apparatus comprising:

a basic field magnet having an examination space therein;

a supporting structure surrounding said examination space and having first and second concentric, substantially parallel surfaces, said second surface being disposed at a larger distance from said examination space than said first surface, and said first and second surfaces having an interspace therebetween;

at least one gradient coil having useful conductors disposed on said first surface and connecting conductors disposed on said second surface;

a conductors of said radio-frequency antenna composed of a plurality of straight conductors disposed perpendicularly relative to said useful conductors of said at least one gradient coil, said radio-frequency antenna being completely contained in said interspace between said first and second surfaces; and a radio-frequency shield disposed between said connecting conductors of said at least one gradient coil and said radio-frequency antenna.

2. A nuclear magnetic resonance tomography apparatus as claimed in claim 1 wherein said radio-frequency has radio-frequency current flowing therein in a first direction, and wherein said useful conductors of said at least one gradient coil are disposed perpendicularly to said first direction.

3. A nuclear magnetic resonance tomography apparatus as claimed in claim 2 wherein said basic field magnet generates a magnetic field having a magnetic field direction in said examination space, and wherein said first direction coincides with said magnetic field direction.

4. A nuclear magnetic resonance tomography apparatus as claimed in claim 1 wherein said radio-frequency antenna produces an electrical field when current is flowing in said radio-frequency antenna, and wherein the useful conductors covering the radio-frequency antenna in the direction of the examination space are grounded with respect to radio-frequency thereby shielding the electrical field produced by the antenna.

5. A nuclear magnetic resonance tomography apparatus as claimed in claim 1 further comprising means for actively shielding said at least one gradient coil.

6. A nuclear magnetic resonance tomography apparatus as claimed in claim 1 comprising a cylindrical supporting tube surrounding said examination space, and wherein said radio-frequency and said useful conductors of said at least one gradient coil are disposed at an interior side of said support tube facing said examination space, and wherein said connecting conductors of said at least one gradient coil penetrate through said supporting tube and proceed at an exterior side of said carrying tube facing away from said examination space.

\* \* \* \* \*